US006603891B2

(12) United States Patent
Schumann

(10) Patent No.: US 6,603,891 B2
(45) Date of Patent: Aug. 5, 2003

(54) OSCILLOSCOPE PROBE WITH FIBER OPTIC SENSOR FOR MEASURING FLOATING ELECTRICAL SIGNALS

(76) Inventor: Mathias Schumann, Heimgarten 11, D-09127 Chemnitz (DE)

(*) Notice: Subject to any disclaimer, the term of this patent is extended or adjusted under 35 U.S.C. 154(b) by 163 days.

(21) Appl. No.: 09/885,181

(22) Filed: Jun. 20, 2001

(65) Prior Publication Data

US 2002/0018609 A1 Feb. 14, 2002

(30) Foreign Application Priority Data

Jun. 23, 2000 (DE) ..................................... 200 11 084 U

(51) Int. Cl.[7] ................................................. G02B 6/00
(52) U.S. Cl. ............................. 385/12; 385/2; 385/3; 356/477
(58) Field of Search ............................. 385/1, 2, 3, 12, 385/100; 356/478, 477; 250/227.21, 227.27

(56) References Cited

U.S. PATENT DOCUMENTS

| | | | |
|---|---|---|---|
| 5,267,336 A | * 11/1993 | Sriram et al. ............... | 385/2 |
| 5,465,043 A | 11/1995 | Sakai ........................... | 324/96 |
| 6,388,434 B1 | * 5/2002 | Davidson et al. ............. | 324/96 |
| 6,507,014 B2 | * 1/2003 | Ito et al. .................. | 250/227.11 |

* cited by examiner

*Primary Examiner*—David V. Bruce
*Assistant Examiner*—Therese Barber
(74) *Attorney, Agent, or Firm*—Collard & Roe, P.C.

(57) ABSTRACT

An oscilloscope probe with a fiber optic sensor for measuring floating electrical signals, the probe modulating a light energy signal with stable intensity in response to an applied input signal. The modulated signal is sent over a fiber optic cable with the electrical signal by means of a voltage-controlled integrated optical interferometer device, using an electro-optical active crystal. No auxiliary electrical power supply is needed for the sensor head. An analog light signal is produced at the output of the sensor head, and transmitted to a receiver unit over this fiber optic cable. The receiver converts the light into an equivalent electrical signal, and transfers it to an oscilloscope. All components of the sensor head are housed in a sealed metallic, shielded package.

6 Claims, 1 Drawing Sheet

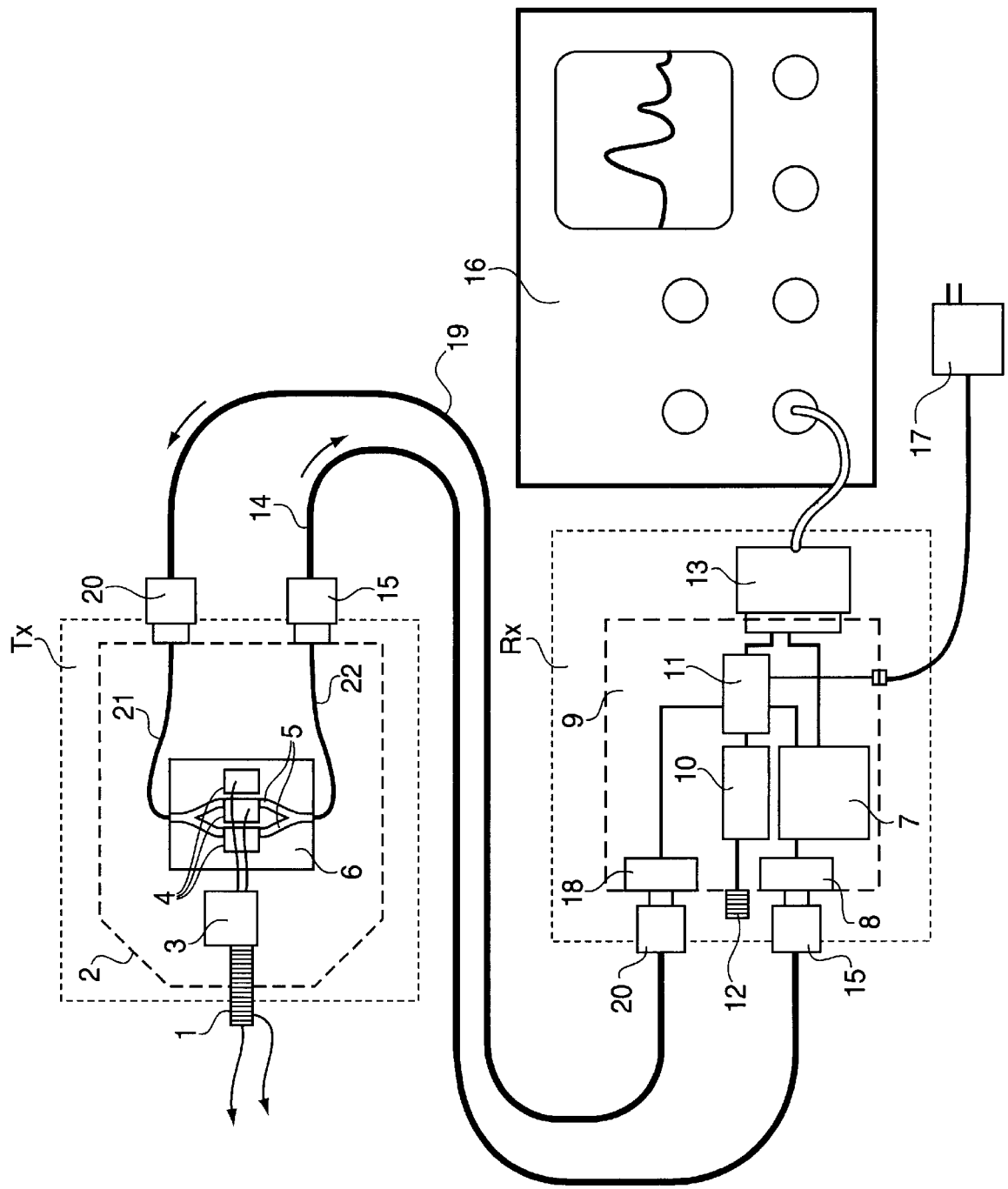

OSCILLOSCOPE PROBE WITH FIBER OPTIC SENSOR FOR MEASURING FLOATING ELECTRICAL SIGNALS

BACKGROUND OF THE INVENTION

1. Field of the Invention

This invention relates to an oscilloscope probe with a fiberoptic sensor for measuring floating electrical characteristics.

2. The Prior Art

Conventionally built oscilloscope probes comprise a sample tip which has to be adapted to the device under test. The probe is generally connected by an electrical wire to an oscilloscope, and includes an electrical component for adjusting the voltages which have to be measured within the measurement range of the oscilloscope, such as a resistive divider or amplifier. To measure voltages with a reference potential which is different from that of the oscilloscope, active differential probes are used. The maximum potential difference to be bridged, between the reference potential of the oscilloscope and the reference potential of the measurement object being tested is determined by the maximum common-mode input voltage range of the measurement amplifier used. Tests on a very high voltage potential cannot be performed this way. Interferences via the electrical wire to the oscilloscope (e.g. to switching transistors in power supplies and in the drive technique) are due to the rapidly changing potential difference or high voltage pulse rate. Moreover, measuring electrical signals in an environment surrounded by strong electromagnetic fields leads to interferences in the test cable setup. Ground loops, built via the test wire due to contact to ground of the device under test with the oscilloscope, also result in distorted test results, or make measurements impossible.

Problems also occur when, for example, a device under test is specifically loaded with unitized glitches (e.g. Burst test) within the context of an interference immunity test. As a result of the physical proximity of the electrical wire to the oscilloscope, there are unwanted interferences in the test setup. Therefore, useful tests can be impossible. Measurements on the device under test within the context of an interference radiation immunity test (HF-radiation) cannot be performed with conventional probes either, as there are interferences in the test cable setup.

Optoelectronic oscilloscope probes with active electronical components such as an amplifier, LED or laserdiode in the sensor head need electrical energy for operation, which has to be supplied by a battery/accumulator. The service life of this energy source is limited. Therefore the battery in the sensor needs to be replaced regularly. Replacing the battery makes long-term or continuous measurements difficult or impossible.

SUMMARY OF THE INVENTION

The present invention provides a means of accurately measuring floating analog or digital electrical signals of a device under test, in view of the above mentioned electrical interferences, and thereby avoids the need of an electrical auxiliary power supply for the operation of the sensor head. The invention provides an oscilloscope probe with a fiber optic sensor for measuring floating electrical signals of test devices.

In the invention, energy in the form of light with a continuous intensity is fed to a sensor head over a fiber optic cable. The light intensity is modulated in an electrooptic active crystal according to the applied electrical signal from the test device. This modulated signal is transmitted to the receiver over a fiber optic cable. The light signal is then converted to an equivalent electrical signal in a receiver unit, and transferred to an oscilloscope. Here, no electrical power supply is needed for the sensor head. The optical waves which have been fed into the sensor head are modulated by means of a voltage controlled integrated optic interferometer device. The signal is transmitted analogously throughout the entire system. Moreover, all the components of the sensor head are housed in a metallic shielded package which is generally sealed.

This invention provides an interference-free measurement of electrical signals in connection with an oscilloscope, and also in environments with significant electromagnetic interference. By sending out the signal over a fiber optic cable and supplying the energy to the sensor head by means of unmodulated light, electrical signals can be measured without any problems for different reference potentials. These reference potentials can then also change with very high voltage pulse rates, without leading to distortion of the signal. As the sensor head doesn't need an electrical auxiliary power supply, the measurement time is unlimited. Furthermore, the design of the sensor head can be kept to a minimum, as there is no need for a battery and power supply unit.

Due to the fact that no active electronic components (amplifier, transistors, . . .) are used in the sensor head, the interference immunity of the setup has been greatly improved. The signals can be sent out over very long distances, without any problems or interference. This also allows safe, accurate and interference-free tests for high-voltage systems. The formation of ground loops in the test setup is avoided by the grounded separated design of the sensor head, and the transmission of the signal by means of the fiber optic cable. The closed metallic shield of the sensor head and the signal transfer over the fiber optic cable also allow interference-free measurements, even under the influence of extremely strong electromagnetical stray fields. The inventive setup allows for analog and digital signals, to be measured so that the setup can be used universally for oscilloscope measurement technology.

Due to the chosen analog transmission process, there is a high transfer bandwidth, and there is the possibility of measuring and transmitting the shortest pulses. The drive level or impedance of the measurement object is very small due to the fact that the drive of the fiber optic sensor is nearly powerless (purely capacitive). Using an integrated-optical modulator based on a voltage controlled interferometer device has the advantage that the control voltages needed for modulation are very small. This way, preamplifiers to adopt the signal to the sensor are no longer needed. Higher test voltages can be adapted using a resistive divider in case this is required.

BRIEF DESCRIPTION OF THE DRAWINGS

Other objects and features of the present invention will become apparent from the following detailed description considered in connection with the accompanying drawing. It should be understood, however, that the drawing is designed for the purpose of illustration only, and not as a definition of the limits of the invention.

The FIGURE shows an oscilloscope probe having a fiberoptic sensor for measuring floating electrical signals according to the invention.

DETAILED DESCRIPTION OF THE PREFERRED EMBODIMENT

Referring to the FIGURE, a test signal is fed into an input contact 1 of a sensor heat TX and subsequently adjusted in a passive resistive divider 3 that is suitable for the control of an electrooptical converter 6, or an interferometer. A laser beam is shown coupled to a single-mode-fiber 19 from a laser diode 18, coupled to interferometer device 6 through a fiber optic cable (Single-Mode) 19, a connection plug 20, and a fiber connection 21. The light-waves are subsequently equally distributed over the two integrated optical waveguides 5 of electro-optical connector 6, having active crystals such as $LiNbO_3$ or KTP. By applying the signal adapted from the test signal of input contact 1, to electrodes 4, the refraction index in both integrated optical waveguides 5 is changed differently, depending upon the voltage. AS a result, signal travel times vary, thus leading to a phase shift of light waves against each other. After the outputs of both wave guides 5 have been coupled together, there are interferences, i.e. there is brightness modulated light at the output of the electrooptical modulator 6 depending on the signal. The output of modulator 6 having this modulated light, is coupled into a fiber 22, and transferred to a receiver component RX over connector 15 and fiber optic cable 14. All the component parts 1, 3, 4, 5, 6, 21, 22 of sensor head TX are housed in a sealed, metallic shielded package 2. Fiber optic cable 14 is connected to the electrooptical transducer 8 of receiver unit RX by means of a connector 15, thus establishing the communication for the transfer of the signal from sensor head TX. The light signal transmitted by optical cable 14, is connected by connector 15 to the input of transducer 8, where it is converted to an electrical signal. This electrical signal is fed to amplifier 7, which adjusts the magnitude of the electrical signal, before coupling it to connector 13, and the input of oscilloscope 16. A separate AC power adapter 17 or power from oscilloscope 16 provide the supply voltages which are needed in receiver unit RX. The power supply unit 11 adjusts these supply voltages as needed. There is a provided calibration generator 10 connected to a power supply unit 11, the signal of which can be sampled at a connector 12, for the calibration of the entire test setup. The components of receiver unit RX are put into a sealed and shielded metallic package 9.

Accordingly, while only a single embodiment of the present invention has been shown and described, it is to be understood that many changes and modifications may be made thereunto without departing from the spirit and scope of the invention as defined in the appended claims.

What is claimed is:

1. An oscilloscope probe for measuring floating electrical signals that are applied to the probe comprising:

a sensor head having an electrooptic crystal converter interferometer;

a first fiber optic cable coupled to said interferometer so that light energy having a continuous intensity is provided to the sensor head, said interferometer modulating the light energy to produce a modulated light signal in response to the applied electrical signal;

a second fiber optic cable having its input coupled to the modulated light signal; and a receiver that is provided the modulated light signal via the second light conducting cable and which converts the modulated light signal to an equivalent electrical signal and provides this electrical signal to an oscilloscope.

2. The oscilloscope probe as recited in claim 1, wherein an electrical power supply is not required for said sensor head.

3. The oscilloscope probe as recited in claim 1, wherein said converter comprises a voltage controlled integrated optical interferometer device for modulating the light energy provided to said probe.

4. The oscilloscope probe as recited in claim 1, wherein all components of said sensor head are housed in metallic sealed package.

5. The oscilloscope probe as recited in claim 1, comprising an optical laser for producing continuous light energy disposed in said receiver and coupled to said first fiber optic cable.

6. The oscilloscope probe as recited in claim 1, wherein said receiver comprises a calibration generator for calibrating the probe and receiver.

* * * * *